United States Patent [19]

Blinov et al.

[11] Patent Number: 5,597,624
[45] Date of Patent: Jan. 28, 1997

[54] METHOD AND APPARATUS FOR COATING DIELECTRICS

[75] Inventors: Leonid Blinov, Moscow, Russian Federation; Wolfgang Neuberger, Monchen-Gladbach, Germany

[73] Assignee: Ceram Optic Industries, Inc., East Longmeadow, Mass.

[21] Appl. No.: 428,769

[22] Filed: Apr. 24, 1995

[51] Int. Cl.$^6$ .................................................. H05H 1/30
[52] U.S. Cl. .................. 427/575; 118/50; 118/723 MP; 118/723 MW; 118/723 VE; 427/248.1; 427/294; 427/585
[58] Field of Search .................... 427/585, 575, 427/248.1, 294; 118/723 VE, 723 MP, 723 MW, 50

[56] References Cited

U.S. PATENT DOCUMENTS 4,714,589 12/1987 Auwerda et al. .................. 427/39
4,944,244 7/1990 Moisan et al. .................. 118/723

Primary Examiner—Bernard Pianalto
Attorney, Agent, or Firm—Bolesh J. Skutnik

[57] ABSTRACT

A method of fabrication of preforms for manufacturing of optical fibers based on surface plasma wave chemical vapor deposition (CVD) is proposed. A surface plasma wave of either the symmetric $E_{01}$ or the hybrid $HE_{11}$ type is excited on the outside surface of a dielectric starting body. The plasma leads to a CVD of doped or undoped silica layers to obtain the preform. The advantages of the method are the absence of any moving parts in the machinery, high deposition rates, minimal precursor gas usage. Equipment to carry out this process is described as well.

17 Claims, 2 Drawing Sheets

METHOD AND APPARATUS FOR COATING DIELECTRICS

BACKGROUND OF THE INVENTION

1. Field of the Invention

The invention relates to a method of fabrication of preforms for manufacturing of optical fibers based on surface plasma wave chemical vapor deposition (CVD) of doped or undoped silica layers on the outside surface of a dielectric starting body of large cross section. Equipment to carry out this process is also described.

2. Information Disclosure Statement

Numerous methods and devices have been proposed to fabricate preforms for the manufacture of optical fibers by plasma CVD. Plasma assisted chemical vapor deposition is superior to classical CVD as far as the efficiency of gas usage is concerned. It also allows higher deposition rates, more reasonable pressures and higher fluorine dopant concentrations in the quartz glass matrix than the conventional alternatives, a feature of practical interest for radiation resistant fibers.

Plasma CVD for preform manufacturing by deposition on the inside of a tube is described in U.S. Pat. No. 4,714,589. A resonator generating a plasma in the inside of the tube is moved mechanically relative to the tube in an axial direction. This plasma dissociates the precursor gas in the tube and leads to the deposition of successive layers of doped or undoped quartz glass on the inner walls with each pulse of the plasma. The number of layers influences the optical quality of preform as the desired parabola-like and smooth refractive index profile needs to be approximated by successive steps. Moving the heavy resonator back and forth mechanically cannot be done practically with speeds exceeding 5–10 m/min, therefore the number of layers achievable by this method is limited. The mechanical construction of the machinery is complicated, and the operating reliability of the process compromised.

Another apparatus and method for plasma CVD of doped or undoped quartz layers on the inside of a starting tube is described in U.S. Pat. No. 4,944,244. This method uses a microwave plasma source whose power is modulated between a minimum and a maximum value leading to the back-and-forth movement of a plasma column inside the tube. As precursor gases are conducted through the tube they dissociate at the plasma front and a layer of silica is thus deposited with each stroke. In such a method no moving parts are required to move the plasma. Problems exist however with the homogeneity of the deposition over the whole length and the U.S. Pat. No. 4,944,244 patent describes an elaborate feed back control mechanism that is intended to overcome these problems. While the patent does not offer any clues as to which waves are excited, it can be assumed that it operates in a multimode regime. It may well be that for the inside deposition with the described feedback mechanism this does not matter indeed.

While this arrangement is clearly superior to the moving resonator arrangement described earlier as no moving mechanical parts are required in the machinery, thus enhancing its reliability and the number of layers that can be deposited in a given period of time, it suffers from the drawback that an elaborate feed back control mechanism is required to assure uniform deposition over the preform length.

All the methods described above deposit on inside walls of a tube and are therefore limited in deposition speeds by the amount of fresh gas that can be brought to the deposition site through the limited cross section of the tube. High concentrations of certain dopants (for example fluorine) are difficult to achieve with the inside deposition methods, due to the high tensile forces generated in the quartz glass body. These forces can lead to fracturing and destruction of the glass body. Furthermore for the manufacturing of fibers with a large core to clad ratio it is much preferable to deposit on a the outside of a commercially available pure quartz starting rod.

OBJECTS AND SUMMARY OF THE INVENTION

It is an object of the present invention to describe a method and apparatus that can deposit CVD layers by means of a plasma generated on the outside of a starting body, without a moving resonator, thus effectively overcoming the limitations of the present state of the art.

It is a further object of the invention to eliminate the need for elaborate feed back control mechanisms.

It was thought that plasma surface waves that are excited on the surface of the dielectric starting body could form an ideal basis for the deposition process. Plasma surface waves have their highest intensity on the starting body/plasma interface and decrease exponentially in intensity with the distance from it.

Out of many possible types of waves that could be excited on the surface of dielectric starting bodies (typically a cylindrical quartz glass rod), only two were found to be sufficiently stable and homogeneous in the deposition effect to satisfy the quality requirements for optical fiber preforms: the symmetric $E_{01}$ wave and hybrid $HE_{11}$ wave.

It was further determined that there are two operating variants of each version that are preferable. A microwave power modulation in a zig-zag manner between a maximum power level $W_{max}$ and a minimum power level $W_{min}$ over time results in a back-and-forth moving plasma front over the outside surface of the starting body. Alternatively, a stepwise change of the power between minimum $W_{min}$ and maximum $W_{max}$ power levels leads to a plasma on-off along the whole surface simultaneously.

Briefly stated, the present invention provides a method of fabrication of preforms for manufacturing of optical fibers based on surface plasma wave chemical vapor deposition. A surface plasma wave of either the symmetric $E_{01}$ or the hybrid $HE_{11}$ type is excited on the outside surface of a dielectric starting body. The plasma leads to a CVD of doped or undoped silica layers to obtain the preform. The advantages of the method are the absence of any moving parts in the machinery, high deposition rates, minimal precursor gas usage. Equipment to carry out this process is described as well.

The above, and other objects, features and advantages of the present invitation will become apparent from the following description read in conjunction with the accompanying drawings, in which like reference numbers in different drawings denote like items.

DESCRIPTION OF PREFERRED EMBODIMENTS

Figure 1:
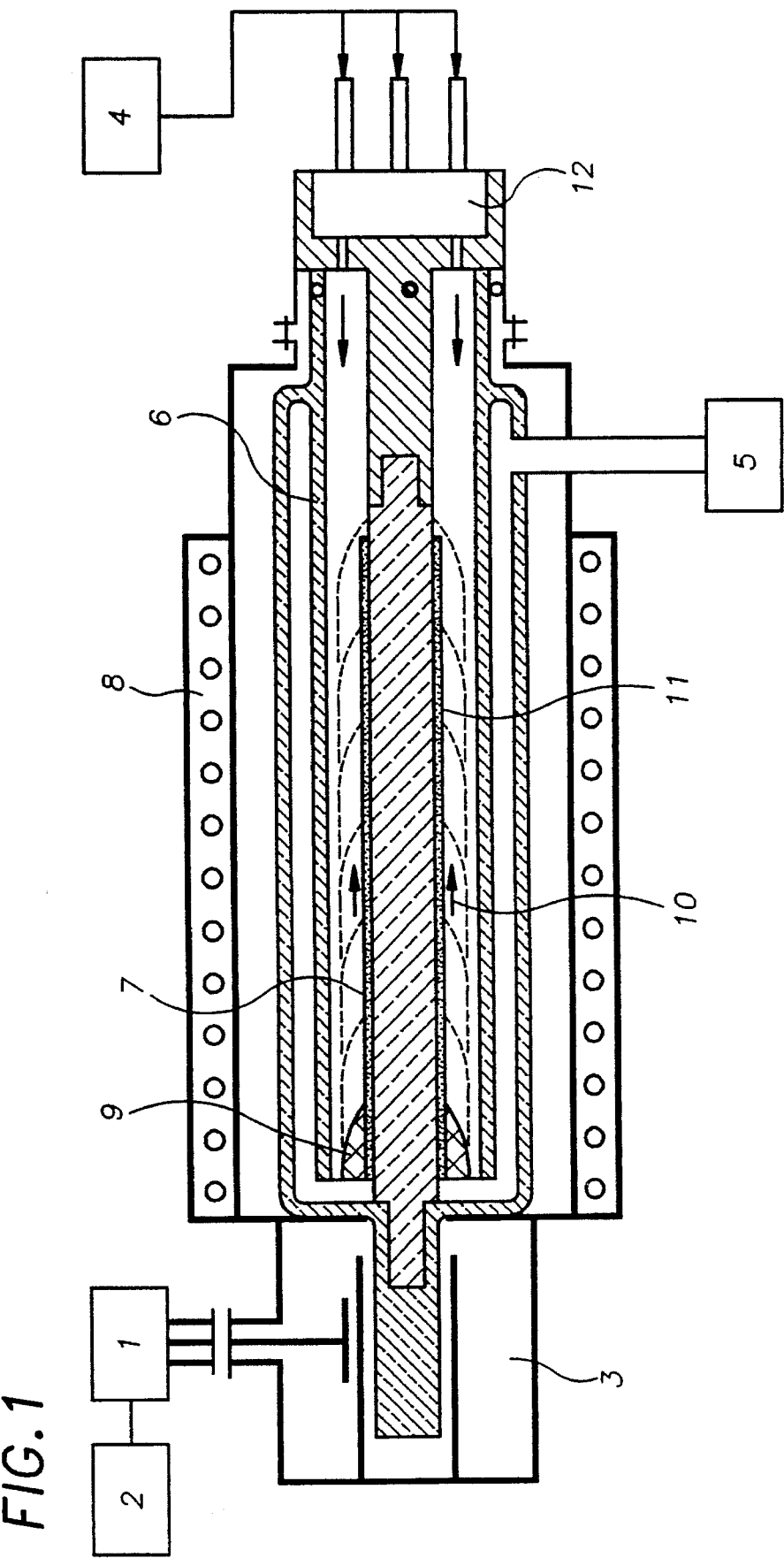
FIG. 1 shows a typical device used to generate surface plasma waves on a filament.

In order to achieve the goal of this invention, deposition on the outside of dielectric bodies several wave forms were theoretically and practically evaluated. It was discovered that two wave types were particularly well suited for the task: the symmetric $E_{01}$ wave and asymmetric hybrid $HE_{11}$ wave. Each these types of waves were found to have their specific advantages.

The symmetric $E_{01}$ wave has the advantage of a particularly simple design of the deposition apparatus. For example, the frequency dependent width of a beam having $E_{01}$ mode configuration at commercial frequency of 2.45 GHz is well matched to the practically interesting diameters of starting body (50 mm). If a preform with a large core/clad ratio should be manufactured, the diameter of the dielectric preform will not change significantly during the course of a deposition process and the frequency and the apparatus will remain well matched until the preform is finished. Due to the asymuthal symmetry of a $E_{01}$ wave field the rotation of the rod during the deposition is not essential.

The asymmetric hybrid $HE_{11}$ wave on the other hand is better suited if a thicker deposition is desired or when starting bodies with a broader range and larger diameters need to be coated in the same apparatus. While the microwave arrangement, with beam power splitter, phase delays, beam recombiner and the resonator design are more complex, the critical frequency is not so dependent on the dielectric dimension, therefore better coatings are achievable with this variant for the above mentioned situations.

The $HE_{11}$ wave field has no cutoff frequency while the $E_{01}$ wave field can be excited only in the case when the wavelength of radiation $\lambda$ is smaller than some critical wavelength $\lambda_{crit}$ given by the equation $$\lambda_{crit}=1.3d(\epsilon_1-\epsilon_2)^{1/2}.$$

In this equation d is the diameter of the dielectric preform, $\epsilon_1$ is the dielectric constant of the waveguiding rod and $\epsilon_2$ is the dielectric constant of the plasma determined by the pressure and composition of the gas mixture, i.e. reagent concentration. Since the dielectric constant of the plasma $\epsilon_2$ is negative, the well confined surface plasma waves can propagate along the surface separating a dielectric material of the dielectric preform and plasma. The dielectric preform is usually placed inside a reactor tube which can have an influence on the propagation of the plasma waves. The influence of walls of the reactor tube on the propagation of the surface plasma waves is negligible when diameter of the tube is twice as large as the diameter d of the dielectric preform.

We have made a choice of $\lambda=5$ cm for deposition on dielectric rod with diameter of 50 mm or more using the frequency 6000 MHz, permitted by ICC. Longitudinal component of electric field in surface plasma wave has a maximum at the surface of preform. Dissociation of starting chemical reagents (as Si $Cl_4+C_3F_8+O_2$) and successive heterogeneous deposition of silica layers (including layers, doped with F) originates at the from edge of the wave, which is moving along the surface of the dielectric preform due to a smooth variation of power of the microwave plasma. High deposition rate is accomplished by high values of E/P, where E is strength of the electric (V/cm) field and P is the pressure of gas mixture(in Torr). The pressure of gas mixture P should be around 1–20 Torr, and the addition of an inert gas, such as argon, can be used to improve the efficiency of the process.

An example of deposition apparatus is schematically shown in FIG. 1. Essential part of this device is exciter 3 of surface plasma waves which feeds the permanent low power discharge 9 (50–100 W) at the input part of reactor to homogenize the parameters of front 10 of the moving ionizing wave, linearize its movement and homogenize the deposition over the length of rod 7. The smooth variation of power of the microwave power source from a value corresponding to low level of permanent initial discharge to some maximum level moves the from of the surface plasma wave forward and back along the whole length of silica rod 7.

The speed of the movement is determined by the frequency of modulation of the microwave source power. Minimum and maximum frequencies of modulation are determined by period of replacement of reaction products with new quantities of starting chemical reagents, i.e. dependent on technical parameters of vacuum system and gas supply system. The power level of the microwave source will also be determined by above mentioned parameters to reach on E/P value needed for a high rate of deposition and a desired length of deposition. Moreover, the power level should be chosen in such a way as to provide complete absorption of microwave power of the surface wave moving along dielectric preform and prevent back reflection of the wave from the wall of resonator. To realize the continuous process of heterogeneous deposition of silica layers on the rod during forward-back electrodynamical movement of the surface plasma wave, the speed of this movement should be a little bit less than the speed of the stream of the gas mixture, to supply the chemical reagents to the plasma front for the period, sufficient for dissociation of gas mixture (Si $Cl_4+C_3F_8+O_2$) and formation of $SiO_2$, Si, O, F particles for successive heterogeneous deposition of silica layers, particularly, F-doped, on the rod surface.

The initial preheating of the silica reactor and the rod to the temperature T=1000°–1250° C. is provided by the furnace 8 in the case of reagents as chlorines. For the metalorganic technology (as for planar optical waveguides for integrated optics) the furnace is not needed due to very low temperatures of the process of deposition of $SiO_2$(doped also)–T=150°–200° C.

Figure 2:
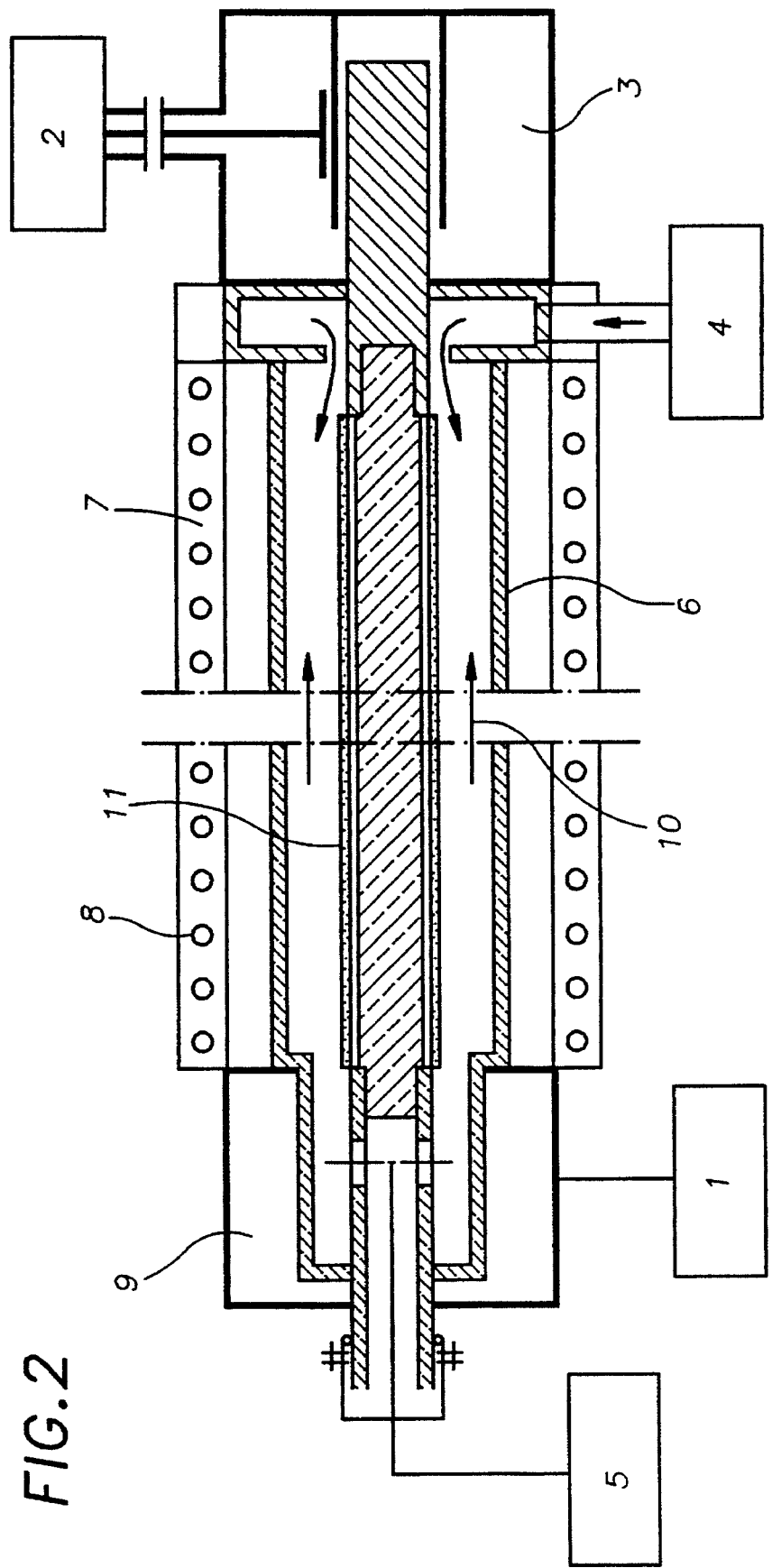
FIG. 2 shows a schematic view of an optical fiber draw process incorporating such a coating step.

Deposition of very thin silica layers can also be accomplished by pulse method of microwave surface plasma wave deposition schematically shown on FIG. 2. In this case the initial plasma is formed by any source at one end of the rod (microwave source is one of the possible sources), while the microwave source at the opposite end of the rod (dielectric waveguide) excites the surface plasma wave pulse with a duration sufficient for heterogeneous deposition (1–2 ms). The pause between the pulses should be equal to the time of reaction products removement and filling of reaction zone by new portion of starting chemical reagents. The power of microwave source is chosen for the complete absorption by plasma (without a reflection) and for the feeding of the stable plasma parameters along the whole length of deposition.

In one preferred embodiment one can employ a polarizer, a splitter and phase shifters combined with exciter 3 to generate a hybrid $HE_{11}$ surface plasma wave on the surface of the starting body rotating around the rod.

In one trial the diameter of tube reactor was 120 mm, the diameter of the rod was 50 mm and the desired length of deposition zone was 400 mm long. The initial discharge in Ar at microwave power 200 W at frequency 2450 Mhz has been employed. The deposition process included three stages.

1st stage: Rod treatment during 10–15 min at power 100–4500 W, pressure of gas mixture P=50–100 Torr and temperature T=1700° C. Speed of movement of the plasma wavefront is equal to 1–5 m/s. Furnace is not heated.

2nd stage: Supply of oxygen (4500 cm$^3$/min), hydrogen (100 cm$^3$/min) and SiCl$_4$(1000 cm$^3$/min) at pressure P=3.8 Torr, power 200–5500 W and the furnace temperature T=1200°–1250° C. to deposit 100 µm of SiO$_2$ layer.

3rd stage: Supply of C$_2$F$_6$ (80 cm$^3$/µm) at pressure P=8 Torr to deposit 2.5 mm of F-doped SiO$_2$. Duration of one layer deposition is 1–2 s, thickness of the layer—200–300 nm, the furnace temperature T=1100°–1150° C., power is 200–5500 W. Final diameter of the preform was about 55 mm at 1 m length. Complete time of deposition was equal to 8 hours.

Having described preferred embodiments of the invention with reference to the accompanying drawings, it is to be understood that the invention is not limited to the precise embodiments, and that various changes and modifications may be effected therein by skilled in the art without departing from the scope or spirit of the invention as defined in the appended claims.

What is claimed is:

1. A method for coating the outside of dielectric starting bodies by a plasma enhanced CVD deposition process with a dielectric layer, using a microwave generated plasma, comprising the steps of:

a. introducing a dielectric starting body with an outer surface to be coated into a deposition chamber and having a length;

b. supplying said deposition chamber with a reactive gas containing a coating material precursor and having a pressure P;

c. generating a plasma in said deposition chamber as surface plasma wave on said dielectric starting body's surface with said surface plasma wave generated as one of the following group—a symmetric $E_{01}$ wave and an asymmetric $HE_{11}$ hybrid azimuthal wave; and d. having said reactive gas react with said surface plasma wave depositing at least one layer of a desired coating onto said dielectric starting body.

2. A method according to claim 1, wherein said dielectric starting body has a tubular shape and is selected from the group—fused quartz, synthetic silica, similar ceramic material, said dielectric layers are undoped or undoped silica and said pressure P is between 1 and 20 torr.

3. A method according to claim 1, further comprising:

e. modulating microwave power continuously between a minimum value $W_{min}$ and a maximum value $W_{max}$ such that said surface plasma wave moves along said outside surface of said dielectric starting body uniformly depositing said dielectric layers on said surface.

4. A method according to claim 3, wherein said modulation of said microwave power has a frequency of 0.05 to 1000 Hz and said microwave has a frequency of 500 to 30,000 MHz.

5. A method according to claim 4 used to manufacture preforms for optical fibers, further comprising:

f. superimposing a zone of temperature higher than ambient onto said deposition region so as to aid in removing residual chlorine from a manufactured preform.

6. A method according to claim 1, further comprising:

e. modulating microwave power in a stepwise fashion between a minimum value $W_{min}$ and a maximum value $W_{max}$ such that said deposition process switches on and off over said whole length of said dielectric starting body.

7. A method according to claim 6 wherein an auxiliary discharge is generated on a starting body end positioned opposite to an end of said deposition chamber where said surface plasma wave is generated, wherein pulse duration is between 1–2 ms, wherein $W_{max}$ is chosen so as to minimize power reflection within said deposition chamber and wherein al of said microwave power is homogeneously absorbed in said plasma.

8. A method according to claim 7 used to manufacture preforms for optical fibers, further comprising:

f. superimposing a zone of temperature higher than ambient onto said deposition region so as to aid in removing residual chlorine from a manufactured preform.

9. An apparatus for coating outside surfaces of dielectric starting bodies with dielectric layers by a plasma CVD process comprising:

a. a deposition chamber having a means for introducing a dielectric starting body into a plasma generated within said chamber;

b. a microwave generator system connected to said deposition chamber and having a plasmatron connected to a microwave generator within said system, said plasmatron being positioned near one end of said dielectric starting body;

c. a surface plasma wave generated by said microwave generator system on an outside surface of said dielectric starting body;

d. means to modulate microwave power inputs from said plasmatron between a maximum value $W_{max}$ and a minimum value $W_{min}$ so as to direct deposition of said dielectric layers onto said outside surface of said dielectric starting body.

10. An apparatus according to claim 9, wherein said chamber and said generator system are configured to generate only symmetric $E_{01}$ surface plasma waves on said dielectric starting body's outer surface.

11. An apparatus according to claim 10, further comprising, a load on one end of a deposition zone and a low power discharge initiating device on a dielectric starting body end opposite to said dielectric starting body end adjacent to said plasmatron.

12. An apparatus according to claim 11, further comprising, an additional heating means to heat said dielectric starting body above ambient temperature.

13. An apparatus according to claim 10 wherein two synchronized plasmatrons are used to excite said surface plasma wave and are positioned at opposite ends of said dielectric starting body.

14. An apparatus according to claim 9, wherein said microwave generator system further comprises, a polarizer, a splitter and phase shifters between said generator and said plasmatron such that a rotating E-field is generated around said dielectric starting body's outer surface as an asymmetric $HE_{11}$ hybrid azimuthal surface plasma wave.

15. An apparatus according to claim 14, further comprising, a load on one end of a deposition zone and a low power discharge initiating device on a dielectric starting body end opposite to said dielectric starting body end adjacent to said plasmatron.

16. An apparatus according to claim 15, further comprising, an additional heating means to heat said dielectric starting body above ambient temperature.

17. An apparatus according to claim 14, wherein two synchronized plasmatrons are used to excite said surface plasma wave and are positioned at opposite ends of said dielectric starting body.

* * * * *